United States Patent
Arai et al.

(10) Patent No.: US 10,022,900 B2
(45) Date of Patent: Jul. 17, 2018

(54) APPLICATION DEVICE, IMPRINTING APPARATUS, AND METHOD FOR MANUFACTURING OBJECT

(71) Applicant: CANON KABUSHIKI KAISHA, Tokyo (JP)

(72) Inventors: Tsuyoshi Arai, Utsunomiya (JP); Yoshikazu Miyajima, Utsunomiya (JP); Yutaka Mita, Utsunomiya (JP); Akio Saito, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 391 days.

(21) Appl. No.: 14/721,419

(22) Filed: May 26, 2015

(65) Prior Publication Data

US 2015/0343680 A1    Dec. 3, 2015

(30) Foreign Application Priority Data

May 29, 2014    (WO) .................. PCT/JP2014/064227

(51) Int. Cl.
*B29C 43/58* (2006.01)
*B29C 37/00* (2006.01)
(Continued)

(52) U.S. Cl.
CPC .............. *B29C 43/58* (2013.01); *B29C 37/00* (2013.01); *B29C 43/34* (2013.01); *G03F 7/0002* (2013.01);
(Continued)

(58) Field of Classification Search
CPC ......... B29C 43/58; B29C 37/00; B29C 43/34; B29C 2043/585; B29C 2043/3433; B29C 2037/96; G03F 7/0002
(Continued)

(56) References Cited

U.S. PATENT DOCUMENTS 4,348,248 A * 9/1982 Poncet ................ B29C 37/0064
156/276
6,203,857 B1 * 3/2001 Patrick .................. B05B 7/1606
118/326
(Continued)

FOREIGN PATENT DOCUMENTS

JP    2004-041943 A    2/2004
JP    2010-080632 A    4/2010
(Continued)

*Primary Examiner* — Nahida Sultana
(74) *Attorney, Agent, or Firm* — Canon U.S.A., Inc. IP Division

(57) ABSTRACT

Provided is an application device capable of extracting an imprinting material in which impurities are mixed from a container of the application device and supplying new imprinting material to the container of the application device. An application device according to the present disclosure is used to supply an imprinting material to a substrate in an imprinting apparatus that forms a pattern on the imprinting material on the substrate by using a mold. The application device includes a container unit that contains the imprinting material, and an ejecting unit that is provided on the container unit and that ejects the imprinting material contained in the container unit toward the substrate. The application device is detachably attachable to the imprinting apparatus.

20 Claims, 12 Drawing Sheets

(51) Int. Cl.
*B29C 43/34* (2006.01)
*G03F 7/00* (2006.01)

(52) U.S. Cl.
CPC .. *B29C 2037/96* (2013.01); *B29C 2043/3433* (2013.01); *B29C 2043/585* (2013.01)

(58) Field of Classification Search
USPC .......................................... 264/293; 425/385
See application file for complete search history.

(56) References Cited

U.S. PATENT DOCUMENTS

| | | | | |
|---|---|---|---|---|
| 2003/0037727 | A1* | 2/2003 | Yasuda | B05C 3/09 118/400 |
| 2004/0263544 | A1* | 12/2004 | Kojima | B41J 2/165 347/5 |
| 2005/0048208 | A1* | 3/2005 | Kao | G03F 7/162 427/345 |
| 2005/0150940 | A1* | 7/2005 | Nakamura | F16K 25/04 234/104 |
| 2007/0275114 | A1* | 11/2007 | Cherala | B29C 43/003 425/405.1 |
| 2008/0129970 | A1* | 6/2008 | Furukawa | G03F 7/70341 355/30 |
| 2012/0308715 | A1* | 12/2012 | Miyamoto | H01L 21/6715 427/74 |
| 2014/0191441 | A1* | 7/2014 | Mori | B29C 59/002 264/293 |
| 2015/0158243 | A1* | 6/2015 | Arai | G03F 7/0002 264/488 |
| 2016/0288378 | A1* | 10/2016 | Arai | G03F 7/0002 |
| 2017/0068160 | A1* | 3/2017 | Asada | G03F 7/0002 |

FOREIGN PATENT DOCUMENTS

| | | |
|---|---|---|
| JP | 2011-91104 A | 5/2011 |
| JP | 2011-101851 A | 5/2011 |
| JP | 2012-041521 A | 3/2012 |
| JP | 2013-094778 A | 5/2013 |

* cited by examiner

RETRACTED POSITION

CONNECTING POSITION

RETRACTED POSITION

FILTERING POSITION

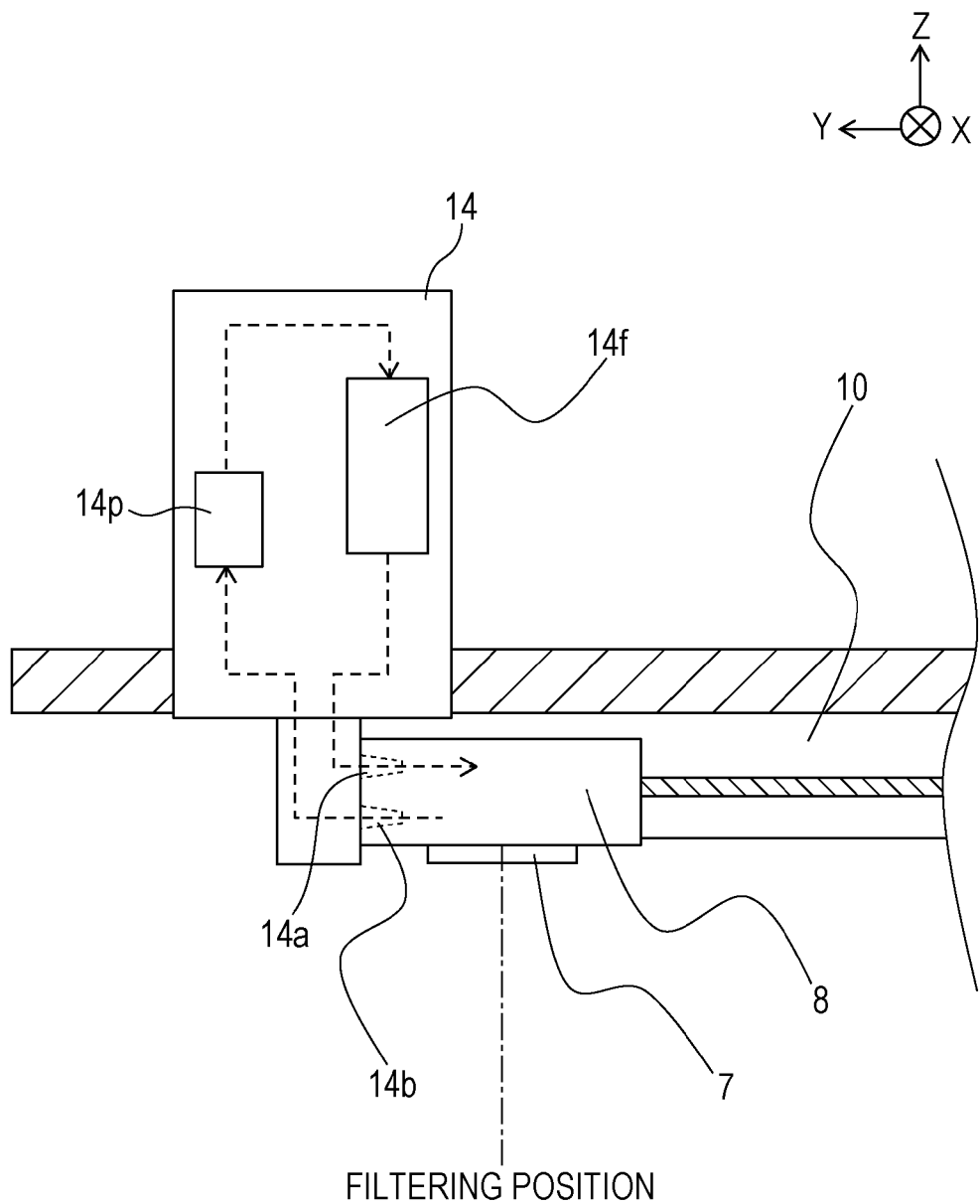

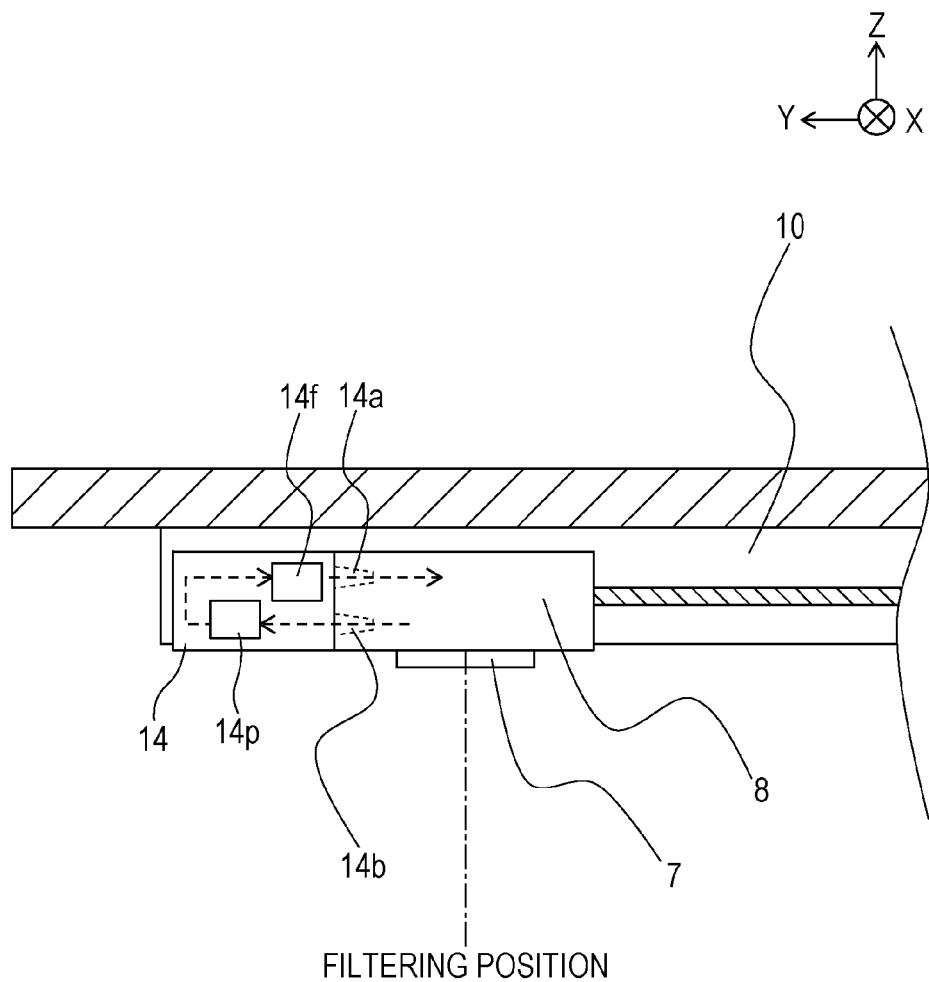

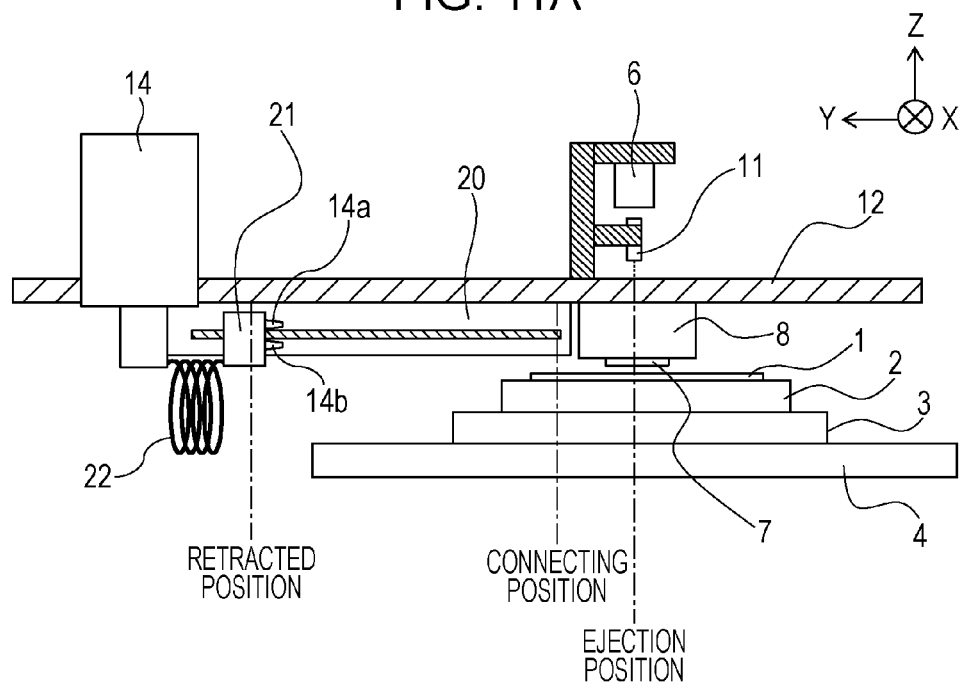
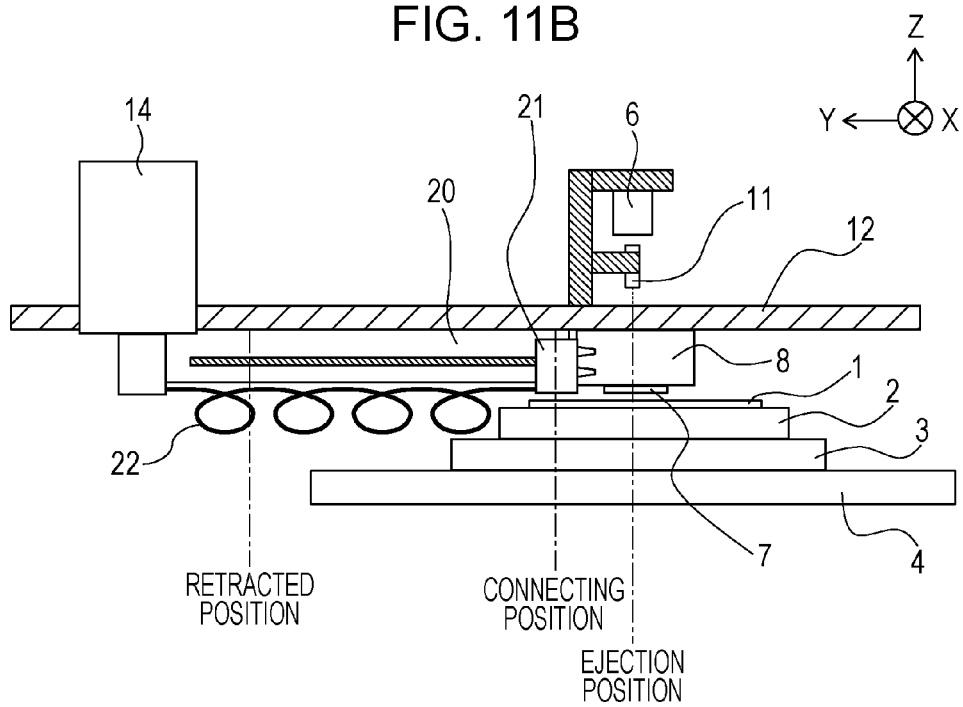

APPLICATION DEVICE, IMPRINTING APPARATUS, AND METHOD FOR MANUFACTURING OBJECT

TECHNICAL FIELD

The present disclosure relates to an imprinting apparatus that forms a pattern on an imprinting material on a substrate by using a mold, an application device included in the imprinting apparatus, and a method for manufacturing an object.

BACKGROUND ART

Imprinting is known as a technology used to manufacture semiconductor devices or the like. Imprinting is a technology in which a pattern is formed on an imprinting material provided on a substrate by using a mold having the pattern formed thereon.

Imprinting is carried out such that each of shot areas of a substrate is subjected to an imprinting process in which a pattern is formed on the substrate with a mold. According to the related art, the imprinting material is supplied to each of the shot areas of the substrate with an application device included in an imprinting apparatus, and then the pattern is formed.

In an application device (dispenser) according to PTL 1, an ejection hole from which the imprinting material is ejected and a tank (container unit) which contains the imprinting material are arranged at separate positions. Therefore, the imprinting material is guided from the tank to the ejection hole through a supply path, and is supplied to the substrate from the ejection hole.

CITATION LIST

Patent Literature

PTL 1 Japanese Patent Laid-Open No. 2011-91104

When the imprinting material contained in the tank is to be replaced with a different imprinting material, or when impurities are mixed in the imprinting material, it is necessary to remove the imprinting material from the tank and the supply path, wash the tank and the supply path, and supply the new imprinting material. Therefore, with the application device according to the related art, the imprinting material cannot be easily replaced with new imprinting material.

SUMMARY OF INVENTION

An application device as disclosed herein is used to supply an imprinting material to a substrate in an imprinting apparatus that forms a pattern on the imprinting material on the substrate by using a mold. The application device includes a container unit that contains the imprinting material, and an ejecting unit that is provided on the container unit and that ejects the imprinting material contained in the container unit toward the substrate. The application device is detachably attachable to the imprinting apparatus.

An application device as disclosed herein is also used to supply an imprinting material to a substrate in an imprinting apparatus that forms a pattern on the imprinting material on the substrate by using a mold. The application device includes a container unit that contains the imprinting material; an ejecting unit that is provided on the container unit and that ejects the imprinting material contained in the container unit toward the substrate; a supply hole formed in the container unit and through which the imprinting material is supplied to the container unit; and a storage unit that stores an imprinting material to be supplied to the container unit. The storage unit includes a connecting portion that is connectable to the container unit. The imprinting material stored in the storage unit is supplied to the container unit through a supplying portion formed on the connecting portion and the supply hole.

An application device as disclosed herein is also used to supply an imprinting material to a substrate in an imprinting apparatus that forms a pattern on the imprinting material on the substrate by using a mold. The application device includes a container unit that contains the imprinting material; an ejecting unit that is provided on the container unit and that ejects the imprinting material contained in the container unit toward the substrate; an extraction hole that is formed in the container unit and through which the imprinting material is extracted from the container unit; a supply hole formed in the container unit and through which the imprinting material is supplied to the container unit; and a storage unit that stores the imprinting material to be supplied to the container unit. The storage unit includes a connecting portion that is connectable to the container unit. The imprinting material stored in the storage unit is supplied to the container unit through a supplying portion formed on the connecting portion and the supply hole. The imprinting material contained in the container unit is extracted to the storage unit through an extracting portion formed on the connecting portion and the extraction hole.

Further features of the present invention will become apparent from the following description of exemplary embodiments with reference to the attached drawings.

BRIEF DESCRIPTION OF DRAWINGS

FIG. 7 illustrates the details of the resin circulating device according to the first embodiment.

FIG. 10 illustrates the details of an application device according to a fourth embodiment.

FIGS. 11A and 11B illustrate the details of a resin filtering device according to a fifth embodiment.

DESCRIPTION OF EMBODIMENTS

Figure 1:
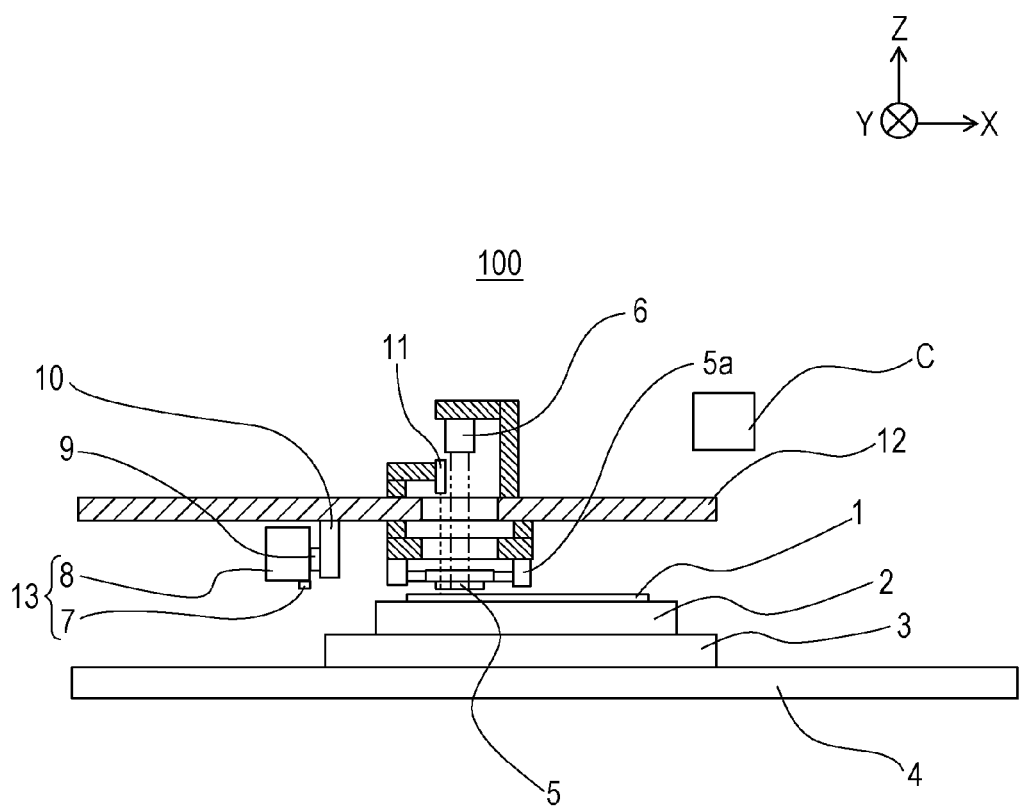
FIG. 1 illustrates the structure of an imprinting apparatus according to a first embodiment.

A preferred embodiment of the present disclosure will now be described in detail with reference to the accompanying drawings. In the drawings, the same components are denoted by the same reference numerals, and redundant descriptions thereof are omitted.

First Embodiment (Imprinting Apparatus)

An imprinting apparatus 100 will be described with reference to FIG. 1. In the description of the first embodiment, a plane on which a substrate 1 (silicon wafer, glass plate) is arranged is defined as an XY plane, and a direction perpendicular to the XY plane is defined as a Z direction. Axes are defined as illustrated in the drawings. The imprinting apparatus 100 described herein is a photo-curing imprinting apparatus in which an imprinting material is cured by irradiation with light (ultraviolet light). An ultraviolet curable resin (resin, resist) is used as the imprinting material. However, the present invention may instead be applied to an imprinting apparatus in which the imprinting material is cured by irradiation with light having a wavelength range different from that of ultraviolet light, or an imprinting apparatus in which the resin is cured by using another type of energy (for example, thermal energy).

The imprinting apparatus 100 is capable of forming a pattern in each of a plurality of shot areas of the substrate 1 by repeating an imprinting cycle. The imprinting cycle is a cycle in which resin that has been applied to the substrate 1 is cured while the resin is in contact with a mold 5 (original plate, mold, template) so that the pattern is formed in one of the shot areas of the substrate 1. The imprinting apparatus 100 forms an element pattern that corresponds to a pattern formed on the mold 5 on a surface of the substrate 1 by transferring the pattern formed on the mold 5 to the resin on the substrate 1.

The imprinting apparatus 100 includes a substrate stage that holds and moves the substrate 1. The substrate stage includes a fine-movement stage 2 capable of moving the substrate 1 in the X and Y directions and rotating the substrate 1 along the XY plane by small amounts and a rough-movement stage 3 capable of moving the substrate 1 in the X and Y directions by large amounts. The imprinting apparatus 100 also includes a base frame 4 that holds the substrate stage (the fine-movement stage 2 and the rough-movement stage 3).

The mold 5, which has a pattern including projections and recesses formed on a surface thereof, is held by a driving device 5a. The driving device 5a is a device for moving the mold 5 in the up-down direction (Z direction), and performs an operation of causing the mold 5 and the resin that has been applied to the substrate 1 to come into contact with each other (imprinting) or separate from each other (releasing). Although the mold 5 is moved and brought into contact with the resin in the imprinting apparatus 100 described herein, the substrate stage may instead be moved in the up-down direction to bring the mold 5 and the resin into contact with each other. Alternatively, the driving device 5a and the substrate stage may both be moved to bring the mold 5 and the resin into contact with each other.

A light source 6 is a device that emits ultraviolet light (ultraviolet-light generating device), and irradiates the resin with the ultraviolet light in the state in which the mold 5 and the resin are in contact with each other. The resin is cured when irradiated with the ultraviolet light. The light source 6 includes, for example, a halogen lamp which generates i-line or g-line and optical elements having a function of focusing or shaping the generated light.

An alignment scope 11 detects an alignment mark formed on the mold 5 and an alignment mark formed on the substrate 1. The imprinting apparatus drives the substrate stage and the driving device 5a on the basis of the detection result of the alignment marks so that the substrate 1 and the mold 5 are positioned relative to each other. The driving device 5a, the light source 6, and the alignment scope 11 are supported by a board 12.

The imprinting apparatus 100 includes an application device 13 (dispenser) that applies the resin to the substrate 1. The application device 13 includes a nozzle 7 (ejecting unit) from which the resin is ejected and a resin tank 8 (container unit) that contains the resin. The application device 13 according to the first embodiment is a cartridge-type application device 13 in which the nozzle 7 and the resin tank 8 are integrated with each other. The application device 13 is detachably attached to the imprinting apparatus 100. The resin tank 8 of the application device 13 is held by a movable portion 9. The nozzle 7 and the resin tank 8 can be moved between an ejection position and a retracted position by driving the movable portion 9 with movable-portion driving means 10.

Figure 2:
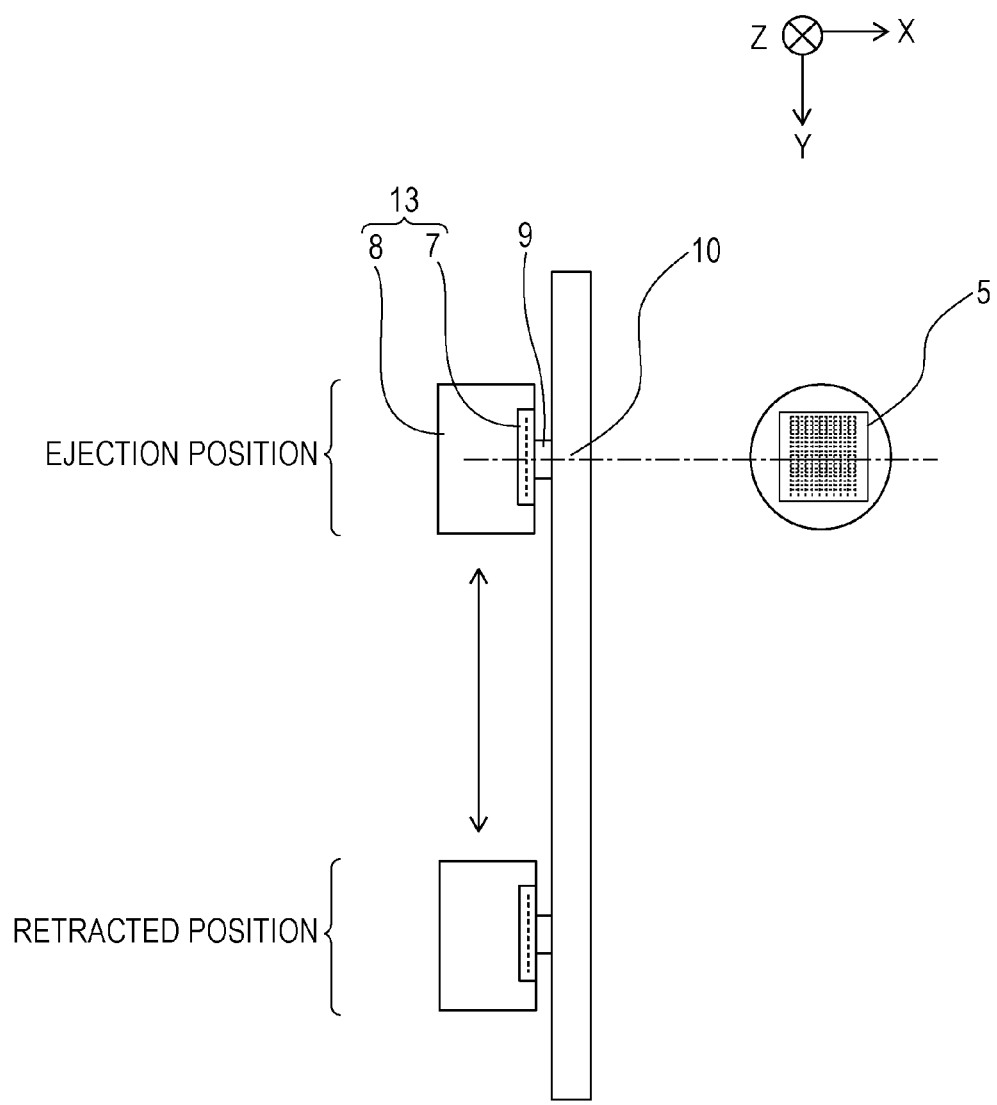
FIG. 2 illustrates a mechanism of an application device according to the first embodiment.

FIG. 2 illustrates the application device 13 and the mold 5 in the state in which the imprinting apparatus 100 is viewed from the substrate-stage side (−Z-direction side). The nozzle 7 has a plurality of ejection holes formed therein. In the application device 13, the resin is supplied from the resin tank 8 to the ejection holes in the nozzle 7, and is ejected toward the substrate 1 from the ejection holes. The nozzle 7 of the application device 13 includes, for example, a piezoelectric inkjet head in which a plurality of ejection holes are formed. Piezoelectric elements, for example, are arranged in the ejection holes to control the positions at which the resin is applied to the substrate 1 by the application device 13 and the amount of resin that is applied. The piezoelectric elements are controlled on the basis of operation commands transmitted from a controller C. The application device 13 according to the present embodiment is detachably attached to the imprinting apparatus 100. Therefore, the application device 13 includes wires through which control signals are transmitted from the controller C to the piezoelectric elements and contact terminals (not shown) through which the application device 13 is connected to the imprinting apparatus 100. When the application device 13 is at the ejection position, the resin is ejected toward the substrate 1. When the application device 13 is at the retracted position, the resin is supplied to the resin tank 8 or extracted from the resin tank 8, as described below. Since the application device 13 is detachably attached to the imprinting apparatus 100, when the application device 13 is at the retracted position, the cartridge-type application device 13 can be removed from the movable portion 9 and replaced with another application device 13.

Figure 3:
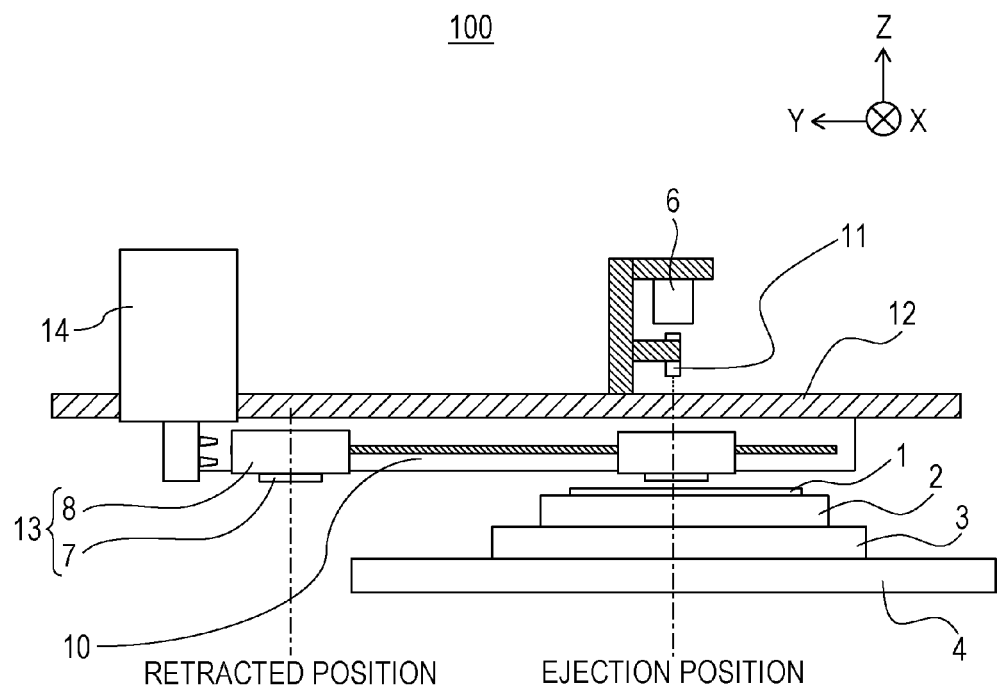
FIG. 3 illustrates the structure of the imprinting apparatus according to the first embodiment.

FIG. 3 illustrates a resin circulating device 14 included in the imprinting apparatus 100. The resin circulating device 14 functions as a resin storage unit in which new resin to be supplied to the resin tank 8 is stored. The resin circulating device 14 is located near the retracted position of the application device 13. The resin circulating device 14 may have a function of extracting the resin from the resin tank 8 in addition to a function of supplying the resin to the resin tank 8. The resin circulating device 14 may also have a function of removing impurities (particles) mixed in the resin extracted from the resin tank 8. The resin circulating device 14 may be included in the application device 13.

(Imprinting Operation)

Next, an imprinting operation according to the first embodiment will be described with reference to FIGS. 4A to 4D. The imprinting apparatus 100 includes the controller C.

The controller C includes a memory that stores a program for controlling the operation of the imprinting apparatus 100 and a processor that executes the program stored in the memory. The controller C outputs signals for controlling each unit included in the imprinting apparatus 100 in accordance with the executed program.

Figure 4A:
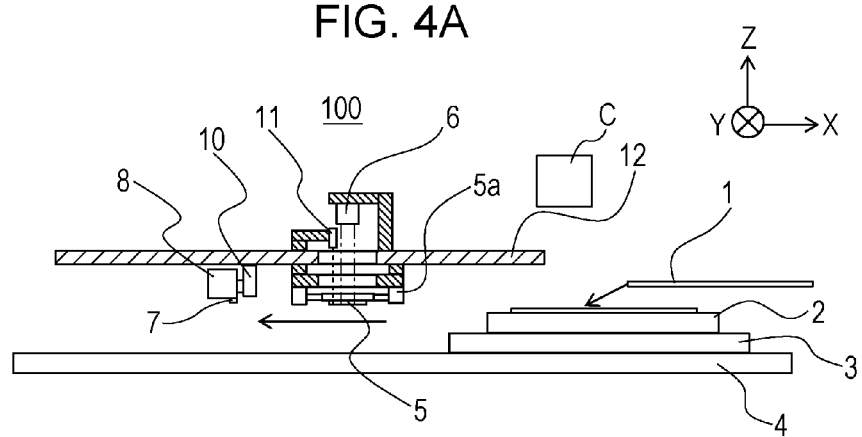
FIGS. 4A to 4D illustrate an imprinting operation according to the first embodiment.

First, the substrate 1 is inserted into the imprinting apparatus 100, and is placed on the substrate stage (the fine-movement stage 2 and the rough-movement stage 3) (FIG. 4A).

Figure 4B:
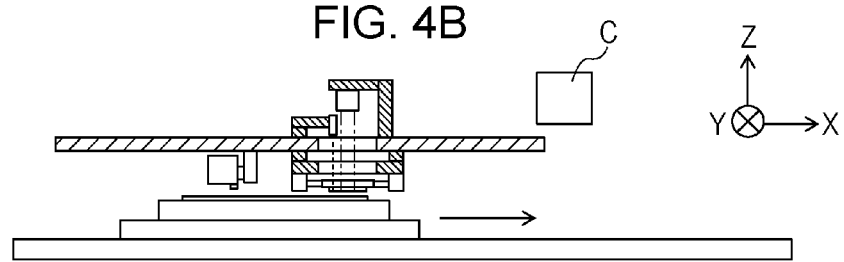

The substrate 1 placed on the substrate stage is moved to a position below the nozzle 7 of the application device 13 disposed at the ejection position. A predetermined amount of resin is ejected from the nozzle 7 while the substrate 1 is being moved by the substrate stage, so that the resin is applied to a shot area of the substrate (FIG. 4B).

Figure 4C:
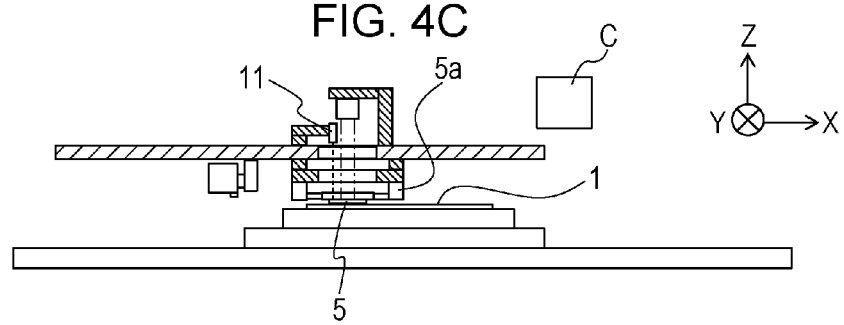

A portion of the substrate 1 to which the resin is applied (shot area) is moved to a position below the mold 5. Then, the mold 5 is moved downward by the driving device 5a, so that the mold 5 approaches the substrate 1 and comes into contact with the resin on the substrate 1. When the mold 5 approaches the substrate 1, the alignment scope 11 detects the alignment mark on the substrate 1 and the alignment mark on the mold 5. The imprinting apparatus 100 positions the substrate 1 and the mold 5 relative to each other on the basis of the result of the detection of the alignment marks performed by the alignment scope 11 (FIG. 4C).

Figure 4D:
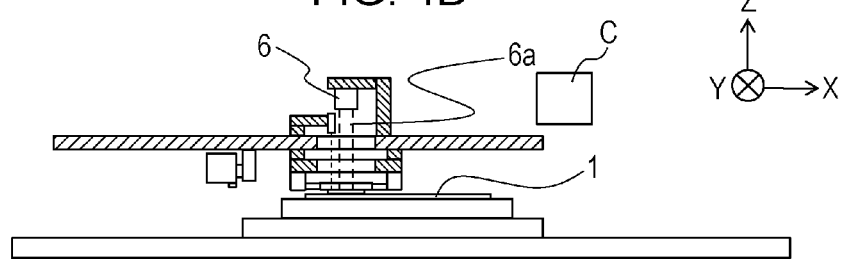

In the state in which the mold 5 and the resin are in contact with each other, the light source 6 emits ultraviolet light 6a. The ultraviolet light 6a emitted from the light source 6 passes through the mold 5, so that the resin is irradiated with the ultraviolet light 6a (FIG. 4D).

After the resin is cured, the gap between the substrate 1 and the mold 5 is increased so that the mold 5 is separated from the cured resin (releasing). Thus, the pattern of the mold 5 is transferred to the resin on the substrate 1, and the imprinting operation is finished.

(Formation of Defective Pattern)

The imprinting apparatus 100 is capable of forming the pattern in a plurality of shot areas of the substrate 1 or on a plurality of substrates 1 by repeating the above-described imprinting operation. In the case where a defective pattern is formed by the imprinting apparatus 100, there is a possibility that impurities are mixed in the resin applied to the substrate 1. The impurities include, for example, particles that have been removed from the nozzle 7 or the resin tank 8 and mixed into the resin, part of the resin contained in the resin tank 8 that has been degraded and gelatinized, or part of the resin that has been cured and transformed into solid particles.

In the case where impurities are mixed in the resin contained in the resin tank 8 as described above, it is necessary to replace the application device 13 with another application device 13 that contains resin that is free from impurities. When a cartridge-type application device 13 that contains resin that is free from impurities is prepared in advance, the cartridge-type application device 13 that contains the resin in which impurities are mixed can be simply removed and replaced with a new application device 13. In addition, also when the resin contained in the resin tank 8 is consumed, the application device 13 can be replaced with a new application device 13. Moreover, also when different resin materials are to be supplied to the substrate 1, when cartridge-type application devices 13, in each of which ejection holes and a container are integrated together, are prepared for the respective resin materials, switching between the resin materials can be easily performed.

The nozzle 7, which has ejection holes formed by micromachining, is expensive. If new resin can be supplied to the resin tank 8 when the amount of resin in the resin tank 8 is not sufficient, the nozzle 7 can be efficiently utilized.

In addition, resins used for imprinting are expensive. In the case where impurities are mixed in the resin contained in the resin tank 8, if the impurities can be removed from the resin, the resin can be prevented from being wasted.

Accordingly, a case in which the resin circulating device 14 is used to supply the resin to the resin tank 8 or remove impurities from the resin will now be described.

(Supply and Removal of Resin)

Figure 5A:
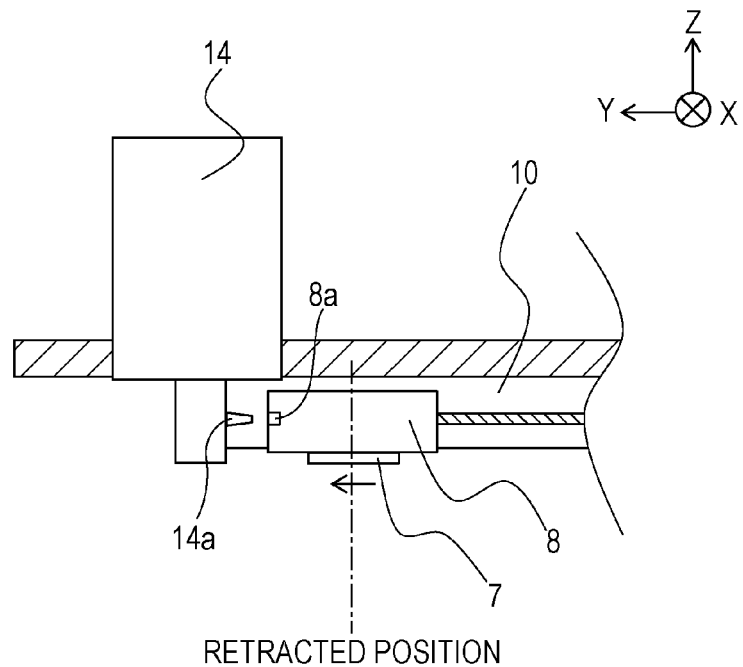
FIGS. 5A and 5B illustrate a resin circulating device and a resin tank according to the first embodiment.
Figure 5B:
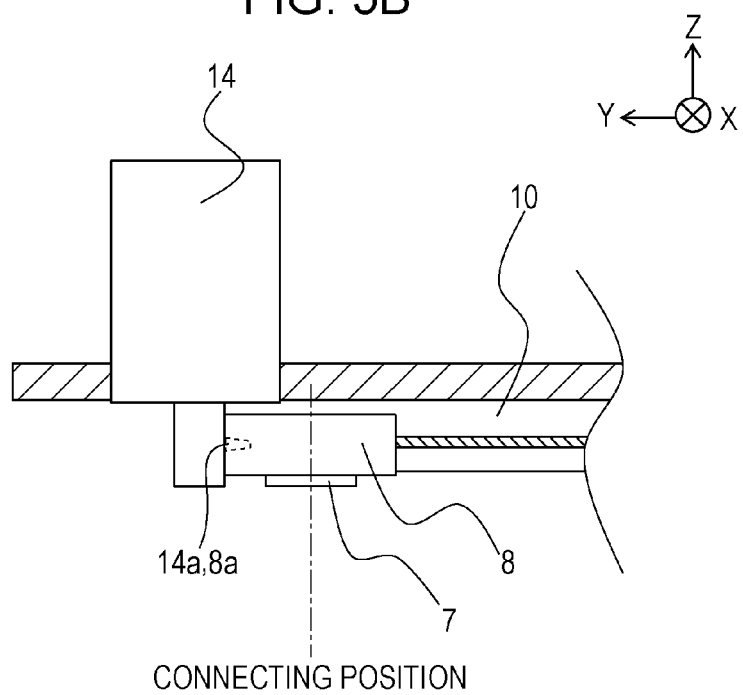

FIGS. 5A and 5B illustrate the resin circulating device 14, which is located near the retracted position, and the resin tank 8, which is provided with the nozzle 7. The resin circulating device 14 includes a supplying portion 14a (first connecting portion) through which the resin is supplied to the resin tank 8. The resin tank 8 has a supply hole 8a which is connectable to the supplying portion 14a and through which the resin supplied from the resin circulating device 14 passes. As illustrated in FIG. 5A, when new resin is to be supplied to the resin tank 8 or impurities are to be removed from the resin, the nozzle 7 and the resin tank 8 are moved to the retracted position. Then, the resin tank 8 is moved to a connecting position, so that the resin circulating device 14 and the resin tank 8 are connected to each other through the supplying portion 14a and the supply hole 8a. The supplying portion 14a may instead be moved to be connected to the supply hole 8a.

The resin circulating device 14 stores new resin (resin free from impurities), and the resin is supplied from the resin circulating device 14 to the resin tank 8 through the supplying portion 14a and the supply hole 8a. A filter may be disposed in the resin circulating device 14, and the resin that has been filtered by the filter may be supplied to the resin tank 8.

The resin circulating device 14 may have a function of extracting the resin from the resin tank 8 and filtering the resin, in addition to the function of supplying the resin. In the case where there is a possibility that impurities are mixed in the resin contained in the resin tank 8, the resin in the resin tank 8 is extracted to the resin circulating device 14 through the supplying portion 14a and the supply hole 8a in the state in which the supplying portion 14a and the supply hole 8a are connected to each other. After the resin has been extracted, new resin may be supplied to the resin tank 8. Alternatively, the extracted resin may be filtered by a filter, and the filtered resin may be supplied to the resin tank 8.

In the first embodiment, the supplying portion 14a and the supply hole 8a are used both when the resin is extracted from the resin tank 8 and when the resin is supplied to the resin tank 8. Therefore, the resin circulating device 14 has a switching valve that switches between a pipe through which the extracted resin passes and a pipe though which the resin to be supplied passes.

Figure 6A:
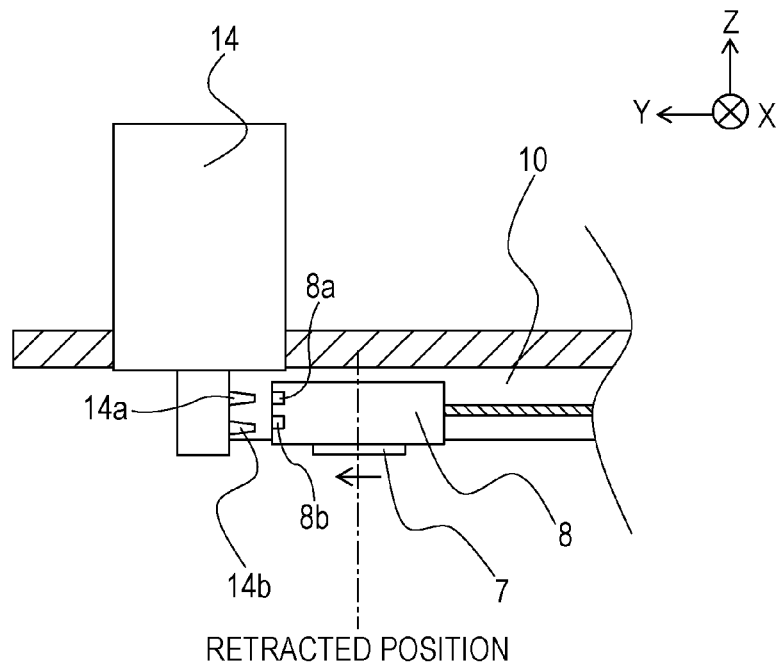
FIGS. 6A and 6B illustrates the resin circulating device and the resin tank according to the first embodiment.
Figure 6B:
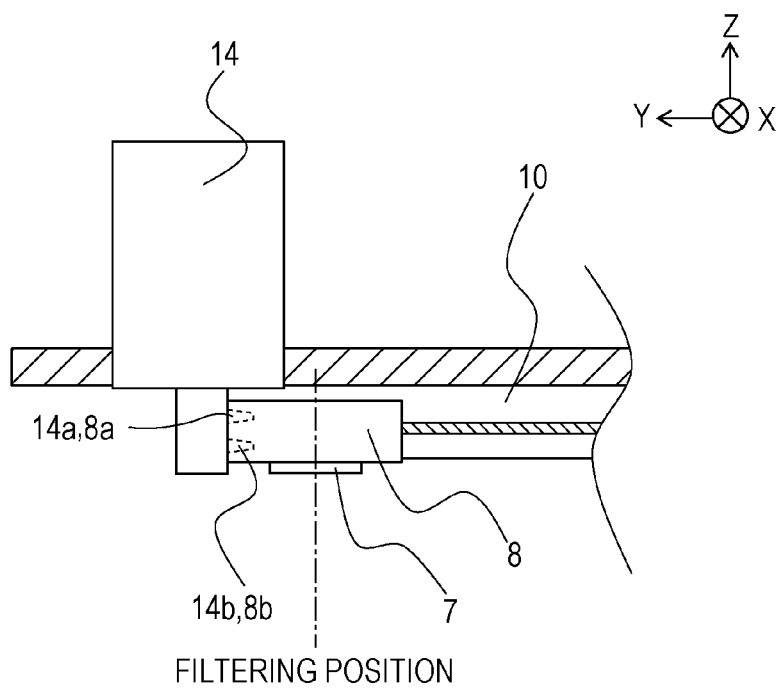

FIGS. 6A and 6B illustrate the resin circulating device 14, which is located near the retracted position of the application device 13, and the resin tank 8, which is provided with the nozzle 7. The resin circulating device 14 includes a supplying portion 14a (first connecting portion) through which the resin is supplied to the resin tank 8, and an extracting portion 14b (second connecting portion) through which the resin is extracted from the resin tank 8. The resin tank 8 has a supply hole 8a which is connectable to the supplying portion 14a and through which the resin supplied from the resin circulating device 14 passes, and an extraction hole 8b which is connectable to the extracting portion 14b and through which the resin to be extracted to the resin circulating device 14 passes. As illustrated in FIG. 6A, when impurities mixed in the resin are to be removed, the nozzle 7 and the resin tank 8 are moved from the ejection position to the retracted position of the application device 13. Then, the nozzle 7 and the resin tank 8 are moved to a filtering position by the movable-portion driving means 10, as illustrated in FIG. 6B. When the resin tank 8 is moved to the filtering position, the resin circulating device 14 and the resin tank 8 are connected to each other through the supplying portion 14a and the supply hole 8a, and through the extracting portion 14b and the extraction hole 8b.

FIG. 7 illustrates the details of the inner structure of the resin circulating device 14. The supplying portion 14a is connected to a path for supplying the resin from the resin circulating device 14 to the resin tank 8. The extracting portion 14b is connected to a path for extracting the resin from the resin tank 8 to the resin circulating device 14. The dotted arrows show the paths of the resin.

A filter 14f, which removes impurities from the resin, is disposed in the resin circulating device 14. The resin in which impurities are mixed is caused to pass through the filter 14f, so that the impurities can be removed from the resin. The resin circulating device 14 also includes a circulation pump 14p for extracting the resin from the resin tank 8 and circulating the resin through the path in which the filter is disposed.

As illustrated in FIG. 7, in the state in which the resin tank 8 and the resin circulating device 14 are connected to each other, the circulation pump 14p is activated by a power supply and a control device (not shown). The resin is extracted (sucked out) from the inside of the resin tank 8 by the circulation pump 14p. The extracted resin is caused to pass through the filter 14f, so that impurities mixed therein is removed. Then, the resin is returned to the resin tank 8. After that, the nozzle 7 and the resin tank 8 are separated from the resin circulating device 14 by the movable-portion driving means 10, and are moved to the ejection position of the application device 13.

Thus, by performing the process of circulating the resin contained in the resin tank 8 through the resin circulating device 14, impurities mixed in the resin contained in the resin tank 8 can be removed. Accordingly, formation of a defective pattern due to the impurities mixed in the resin can be prevented.

When the resin tank 8 is connected to the resin circulating device 14, pipes in the resin circulating device 14 are preferably filled with the same resin as the resin contained in the resin tank 8. In such a case, the risk that air in the pipes will mix into the resin supplied to the resin tank 8 can be reduced. The pressure in the resin tank 8 may vary in accordance with the operating pressure of the pump. When the pressure in the resin tank 8 varies, there is a risk that the resin will leak through the ejection holes of the nozzle 7 or the outside air will enter the resin tank 8 through the ejection holes. To prevent the leakage of the resist or the entrance of the outside air through the nozzle 7, the resin tank 8 preferably has a hole that is open to the atmosphere (vent hole). In such a case, the vent hole is preferably provided with an air filter to prevent entrance of foreign matter from the outside air.

Second Embodiment

Figure 8:
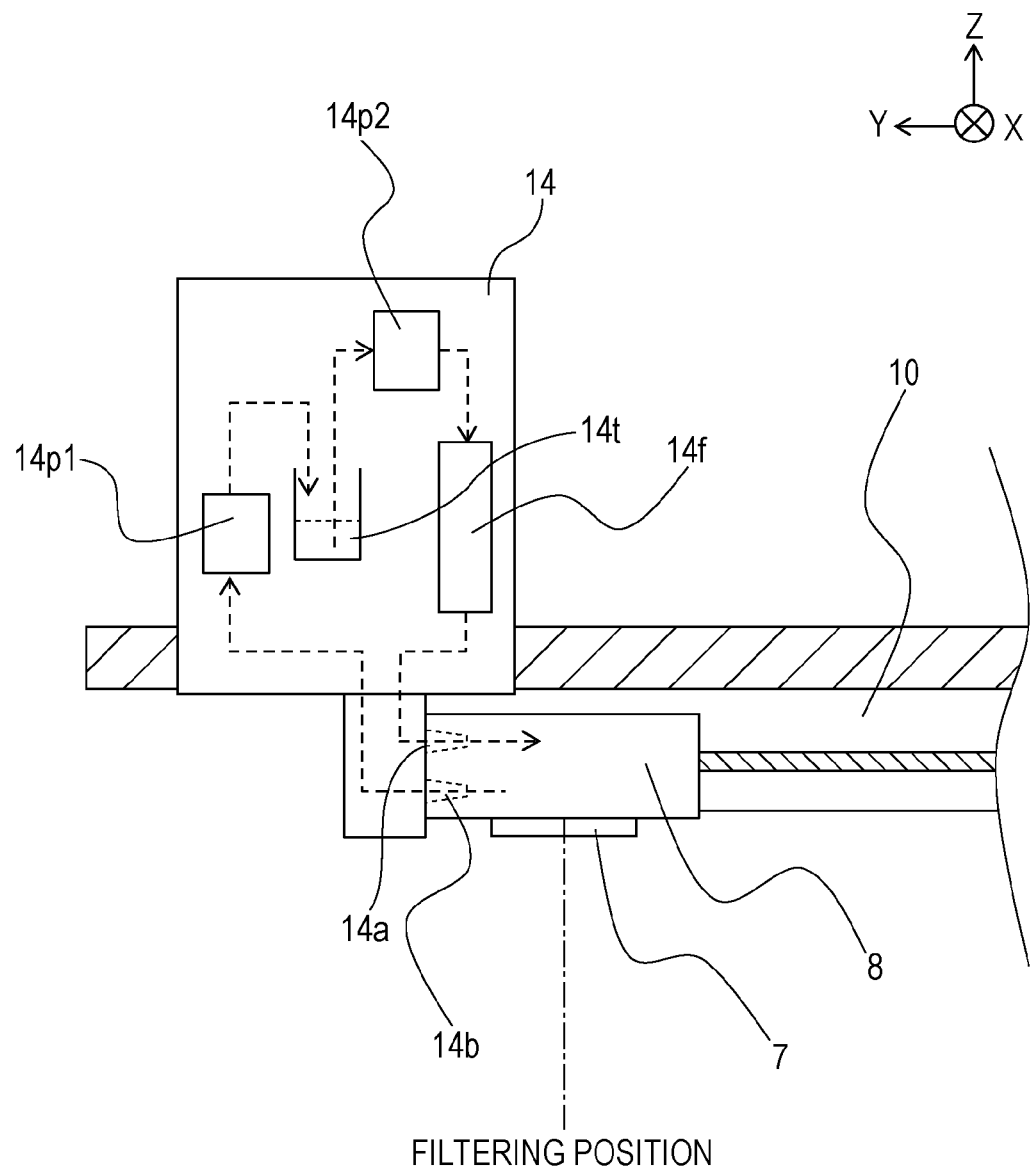
FIG. 8 illustrates the details of a resin circulating device according to a second embodiment.

FIG. 8 illustrates a resin circulating device 14 included in an application device 13 according to a second embodiment. The structure of an imprinting apparatus 100 is similar to that in the first embodiment except for the resin circulating device 14, and descriptions thereof are thus omitted. The same components are denoted by the same reference numerals as those in the first embodiment. The dotted arrows show the paths of the resin.

The resin circulating device 14 illustrated in FIG. 8 is capable of removing air that has entered a piping system included in the resin circulating device 14. Here, the piping system of the resin circulating device 14 includes a buffer tank 14t. A circulation pump 14p1 (extraction pump) is provided to move the resin from the resin tank 8 to the buffer tank 14t, and a circulation pump 14p2 (supply pump) is provided to return the resin from the buffer tank 14t to the resin tank 8 through the filter 14f.

In the imprinting apparatus including the resin circulating device 14 according to the second embodiment, as illustrated in FIG. 8, in the state in which the resin tank 8 and the resin circulating device 14 are connected to each other, the circulation pump 14p1 is activated by a power supply and a control device (not shown). The resin is extracted (sucked out) from the inside of the resin tank 8 by the circulation pump 14p1. The extracted resin accumulates in the buffer tank 14t. The outlet of the pipe that carries the resin to the buffer tank 14t is arranged so as to be constantly above the liquid surface of the resin in the buffer tank 14t.

Similarly, in the state in which the resin tank 8 and the resin circulating device 14 are connected to each other, the circulation pump 14p2 is activated to suck the resist out of the buffer tank 14t, cause the resist to pass through the filter 14f, and supply the resin to the resin tank 8. A suction hole that is connected to the circulation pump 14p2 and through which the resist is sucked out of the buffer tank 14t is arranged so as to be constantly below the liquid surface of the resin. In other words, the suction of the resist is preferably stopped when the liquid level of the resist is lowered to the suction hole as a result of the suction of the resist. Thus, air can be removed from the pipes of the resin circulating device 14.

According to the above-described second embodiment, the resin is extracted from the resin tank 8 and returned to the resin tank 8 after being filtered by the filter 14f. However, the extraction of the resin may be omitted. For example, in the case where the amount of resin in the resin tank 8 is reduced, the resin circulating device 14 may be regarded as a resin supplying device and used simply to supply the resin to the resin tank 8. In this case, the resin is contained in the buffer tank 14t in advance, and only the circulation pump 14p2 is activated to supply the resin to the resin tank 8. In addition, in the case where the amount of resin to be circulated is insufficient, the resin may be stored in the buffer tank 14t in advance, and the resin in the buffer tank 14t may be supplied to the resin tank 8 when the resin is circulated in the resin circulating device 14.

Third Embodiment

Figure 9:
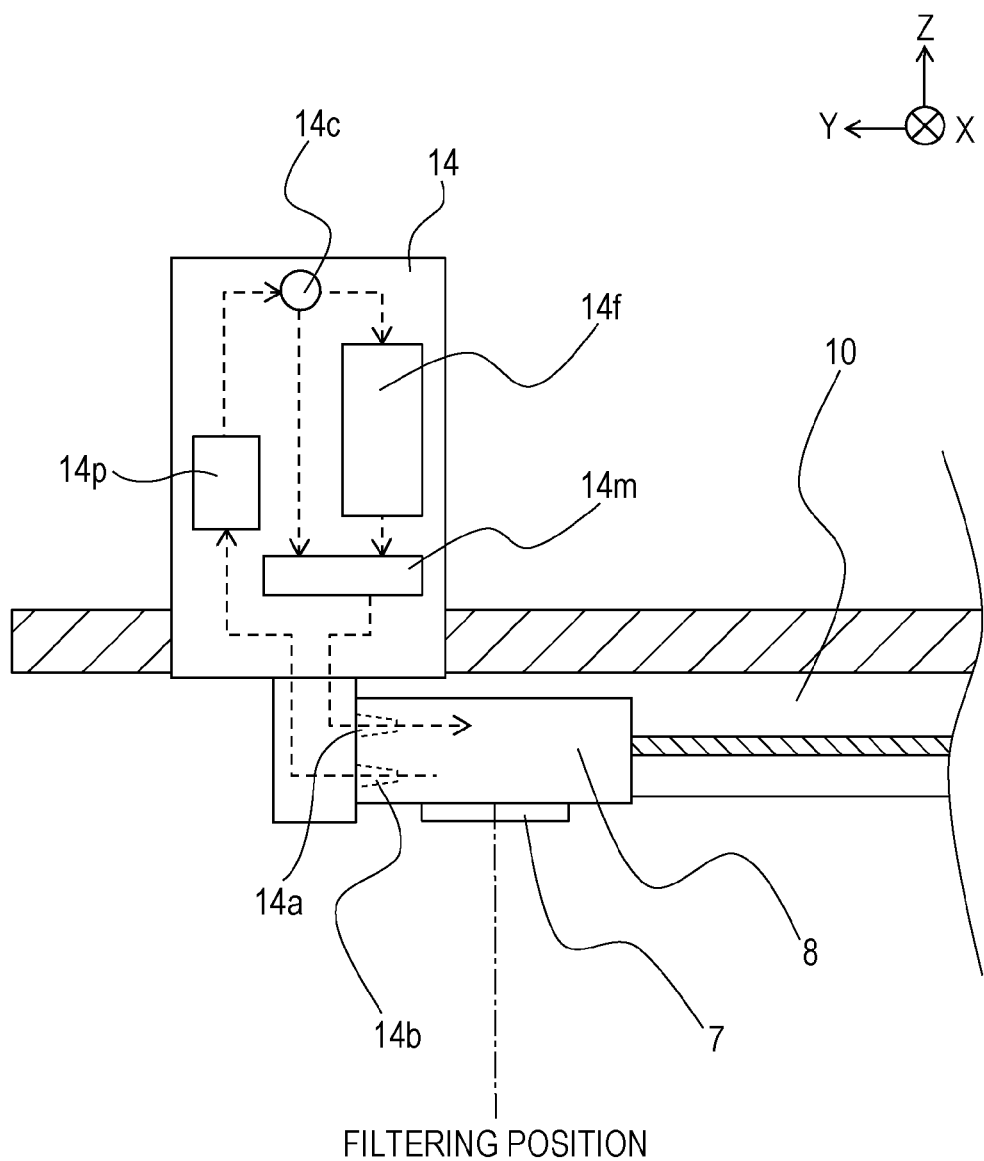
FIG. 9 illustrates the details of a resin circulating device according to a third embodiment.

FIG. 9 illustrates a resin circulating device 14 included in an application device 13 according to a third embodiment. The structure of an imprinting apparatus 100 is similar to that in the first embodiment except for the resin circulating device 14, and descriptions thereof are thus omitted. The same components are denoted by the same reference numerals as those in the first embodiment. The dotted arrows show the paths of the resin.

The resin circulating device 14 illustrated in FIG. 9 may include a resin measurement device 14m that measures the state of the resin. The resin measurement device 14m is a resin quality sensor that measures the quality of the resin. The resin quality sensor may be, for example, a particle counter that measures the amount of impurities in the resin or a sensor that measures the viscosity of the resin. The resin circulating device 14 also includes a switching valve 14c disposed in a path thereof. The switching valve 14c is capable of causing the resin to flow to the filter 14f or the resin measurement device 14m.

In the imprinting apparatus including the resin circulating device 14 according to the third embodiment, first, the circulation pump 14p is activated to extract the resin from the inside of the resin tank 8. The switching valve 14c is switched so that the resin extracted from the resin tank 8 passes through the resin measurement device 14m and the quality of the resin is measured.

In the case where the measurement result obtained by the resin measurement device 14m meets the standard of quality (amount of impurities or the like), the resin is returned from the resin circulating device 14 to the resin tank 8 through the supplying portion 14a.

In the case where the measurement result does not meet the quality standard, the switching valve 14c is switched so that the resin flows through the filter 14f. Then, the circulation pump 14p is activated so that the resin returned to the resin tank 8 is extracted again. The resin that has been extracted again passes through the filter 14f, and is thereby filtered so that the impurities mixed in the resin can be removed. Then, the resin measurement device 14m measures the quality of the filtered resin. When the measurement result meets the quality standard, the resin is returned from the resin circulating device 14 to the resin tank 8 through the supplying portion 14a.

When the measurement result of the filtered resin does not meet the quality standard, the switching valve 14c is maintained at such a state that the resin flows through the filter 14f, and the resin is continuously circulated between the resin tank 8 and the resin circulating device 14 until the resin meets the quality standard.

The resin measurement device 14m may be disposed at any location in the resin circulating device 14. For example, the resin measurement device 14m may be located upstream of the switching valve 14c that switches the path of the resin extracted from the resin tank 8. Whether or not the extracted resin needs to be filtered may be determined in advance. Since there is a risk that impurities will be mixed into the resin when the resin flows through the resin circulating device 14, the quality of the resin is preferably measured immediately before the resin is supplied to the resin tank 8. A plurality of resin measurement devices 14m may be provided in the resin circulating device 14.

Fourth Embodiment

FIG. 10 illustrates an application device 13 according to a fourth embodiment. The structure of an imprinting apparatus 100 is similar to that in the first embodiment except for the application device 13, and descriptions thereof are thus omitted. The same components are denoted by the same reference numerals as those in the first embodiment. The dotted arrows show the paths of the resin.

FIG. 10 illustrates the application device 13 according to the fourth embodiment. In the application device 13 according to the fourth embodiment, the resin circulating device 14 is directly attached to the resin tank 8. In the present embodiment, the resin tank 8, the nozzle 7, and the resin circulating device 14 form the application device 13. The resin tank 8 and the resin circulating device 14 are integrated together. When the circulation pump 14p is activated, the resin in the resin tank 8 is extracted through the extracting portion 14b. The resin in the resin tank 8 is extracted through the extracting portion 14b by the circulation pump 14p. The extracted resin flows through the filter 14f, and is thereby filtered so that impurities mixed in the resin can be removed. The resin that has passed through the filter 14f and from which the impurities have been removed is returned to the resin tank 8 through the supplying portion 14a. Since the resin circulating device 14 and the resin tank 8 are integrated together, the resin in the resin tank 8 can be filtered even when the resin tank 8 is at the ejection position. Since the resin tank 8 and the resin circulating device 14 are integrated together, when the resin in the resin tank 8 is consumed (when the amount thereof is reduced to a predetermined amount or less), the application device 13 is moved to the retracted position and is replaced with a new application device 13 with which a resin circulating device 14 is integrated. Alternatively, a supplying unit for supplying the resin to the resin tank 8 may be separately provided, and new resin may be supplied to the resin tank 8 from the supplying unit.

Fifth Embodiment

FIGS. 11A and 11B illustrates a resin circulating device 14 included in an application device 13 according to a fifth embodiment. The structure of an imprinting apparatus 100 is similar to that in the first embodiment except for the resin circulating device 14, and descriptions thereof are thus omitted. The same components are denoted by the same reference numerals as those in the first embodiment.

The application device 13 according to the fifth embodiment does not include the movable portion 9 or the movable-portion driving means 10 for moving the nozzle 7 and the resin tank 8 from the ejection position. Instead, a connecting portion 21 that is movable from the resin circulating device 14 is provided. The connecting portion 21 is driven by a connecting-portion driving means 20. The connecting portion 21 includes the supplying portion 14a and the extracting portion 14b. The connecting portion 21 is connected to the main body of the resin circulating device 14, in which a filter and other components are disposed, with a tube 22. The resin can be circulated between the resin tank 8 and the resin circulating device 14 by causing the resin to pass through the tube 22. The tube 22 includes a tube through which the resin extracted from the resin tank 8 passes and a tube through which the resin to be supplied to the resin tank 8 passes.

In a normal imprinting operation, the connecting portion 21 of the resin circulating device 14 is at a retracted position so that the connecting portion 21 does not interfere with the substrate stage. When it is determined that the resin contained in the resin tank 8 needs to be filtered as described in the above-described embodiments, the connecting portion 21 is moved to a connecting position by the connecting-portion driving means 20, and is connected to the resin tank 8. After the resin tank 8 and the connecting portion 21 have been connected to each other, the resin is filtered as in the above-described embodiments. The resin circulating device 14 may have any of the structures in the above-described embodiments. After the resin has been filtered, the connecting portion 21 is separated from the resin tank 8, and the connecting portion 21 is moved to the retracted position by the connecting-portion driving means 20.

The connecting portion 21 may be moved to the connecting position by the connecting-portion driving means 20 not only when the resin in the resin tank 8 is to be circulated but also when the amount of resin in the resin tank 8 is reduced and the resin is to be supplied to the resin tank 8. Thus, the resin may be supplied through the supplying portion 14*a*.

Sixth Embodiment

Figure 12:
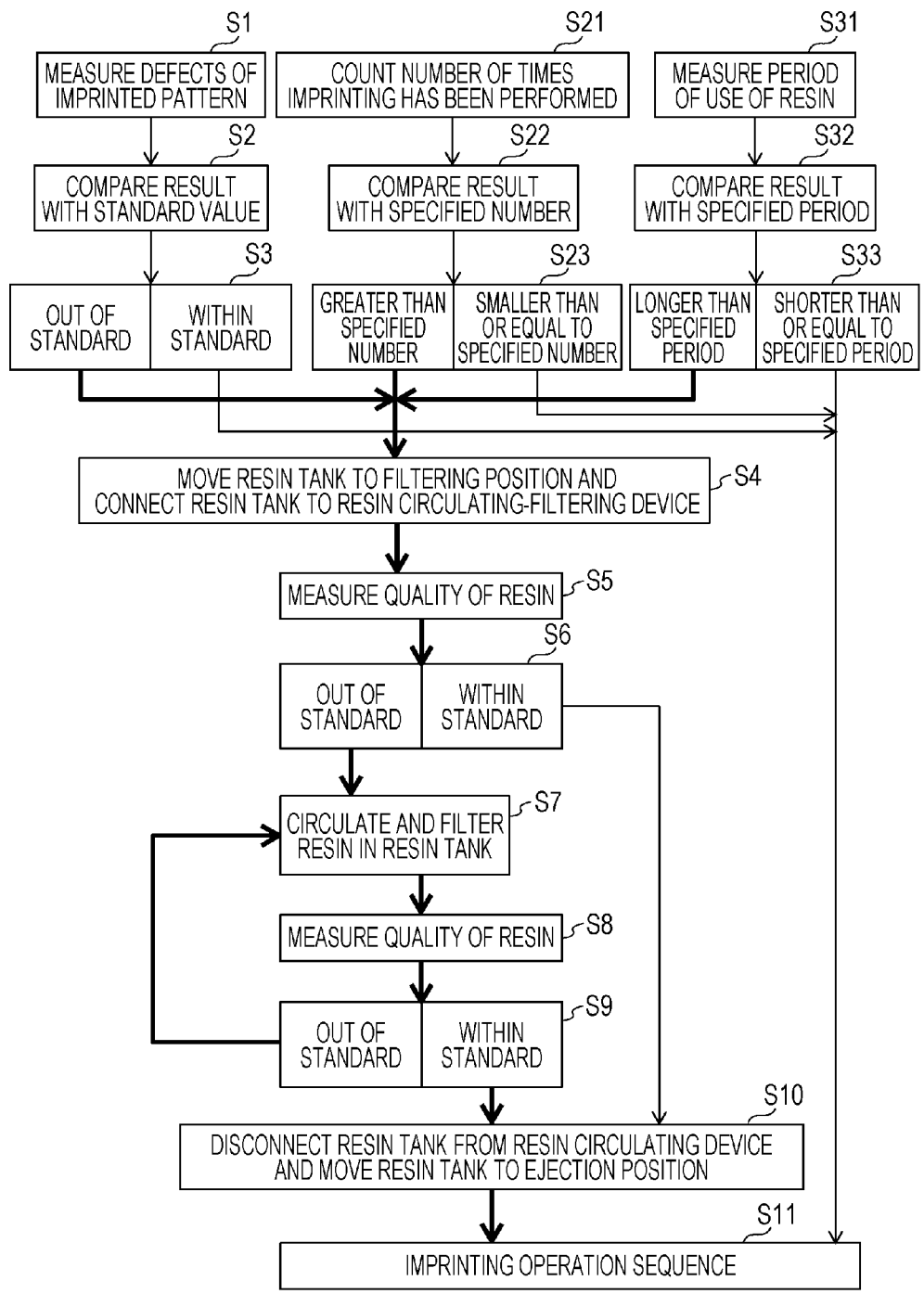
FIG. 12 illustrates a sequence of a resin filtering process according to a sixth embodiment.

In each of the above-described embodiments, whether or not to perform filtering of the resin in the resin tank 8 by using the resin circulating device 14 (filtering process) may be determined from various parameters of the imprinting operation performed by the imprinting apparatus 100. The detailed process of determining whether or not the resin is to be filtered will be described with reference to FIG. 12.

To determine whether or not the amount of impurities in the resin contained in the resin tank 8 has increased, defects of the pattern formed on the substrate in the imprinting operation are measured by a defect detection device (S1 to S3). The detection result obtained by the defect detection device is compared with a standard value (evaluated). When the measurement result is out of the standard (when the amount of defects is large), the resin filtering process may be performed (S4 to S11). Here, the resin filtering process performed by using the resin circulating device 14 including the resin measurement device 14*m* according to the above-described third embodiment (FIG. 9) will be described. However, the application device 13 to be used is not limited to this.

First, the resin tank 8 is moved to the filtering position, and is connected to the resin circulating device (S4). The circulation pump 14*p* is activated so that the resin is extracted from the resin tank 8, and the quality of the resin is measured by the resin measurement device 14*m* (S5). The result of the measurement of the resin is compared with a standard value (S6). When the resin does not meet the quality standard, the resin in the resin tank is circulated and filtered by the filter (S7). The quality of the filtered resin is measured by the resin measurement device 14*m* (S8), and the measurement result is compared with the standard value (S9). The resin is circulated until the quality of the resin filtered by the filter meets the quality standard (S7 to S9).

When the measurement result of the quality of the resin obtained in S5 meets the standard, the extracted resin is supplied to the resin tank 8 again and the resin tank 8 is separated from the resin circulating device 14. The resin tank 8 is moved to the ejection position of the application device 13 (S10), and the imprinting apparatus performs the imprinting operation (S11).

In the above-described filtering process, instead of measuring the defects of the pattern (S1 to S3), the number of times the imprinting operation has been performed by the imprinting apparatus may be counted, and the resist filtering process may be performed when the number of times exceeds a specified number (S21 to S23).

Alternatively, the resist filtering process may be performed when a predetermined time has elapsed after supply of the resin to the resin tank 8 (S31 to S33).

The resin circulating devices 14 according to the above-described embodiments (FIGS. 7 to 11) are structured so as to correspond to the resin tank 8 in which the supply hole 8*a* and the extraction hole 8*b* are formed. However, as illustrated in FIGS. 5A and 5B, the resin tank 8 may instead be structured such that only the supply hole 8*a* is formed. In such a case, the supply hole 8*a* is used to extract and supply the resin. Therefore, an extraction path and a supply path include a shared portion. Accordingly, the corresponding resin circulating device 14 includes a switching valve for switching between the two paths, which are the extraction path and a supply path.

In each of the above-described embodiments, the imprinting apparatus 100 includes a single resin circulating device 14. However, a plurality of resin circulating devices 14 may instead be provided. A plurality of types of resins may be used in the imprinting apparatus 100, and the same number of cartridge-type application devices 13 as the number of types of resins may be provided, each cartridge-type application device 13 including the nozzle 7 and the resin tank 8 that are integrated with each other. In this case, when a plurality of resin circulating devices 14 are provided for the respective types of resins, each type of resin can be efficiently circulated.

It is not necessary that the resin circulating device 14 be provided on the imprinting apparatus 100. When the resin contained in the application device 13, which includes the nozzle 7 and the resin tank 8, needs to be filtered, the resin tank 8 is moved to the retracted position of the application device, and the application device 13 is removed from the imprinting apparatus 100. The resin in the resin tank 8 is filtered by a resin circulating device that is disposed outside the imprinting apparatus 100. During that time, another application device may be attached to the imprinting apparatus 100. Accordingly, the imprinting apparatus 100 can continuously perform the imprinting operation, and reduction in productivity can be suppressed.

(Method for Manufacturing Object)

A method for manufacturing a device (semiconductor integrated circuit device, liquid crystal display device, MEMS, etc.) as an object includes a step of transferring a pattern onto (forming a pattern on) a substrate (wafer, glass plate, film-shaped substrate, etc.) by using the above-described imprinting apparatus. The manufacturing method may additionally include a step of etching the substrate onto which the pattern has been transferred. In the case where another object, such as a patterned media (recording medium) or an optical device, is manufactured, the manufacturing method may include, instead of the etching step, another processing step of processing the substrate onto which the pattern has been transferred.

A semiconductor integrated circuit device is manufactured by performing a front-end process in which an integrated circuit is formed on a wafer and a back-end process in which an integrated-circuit chip formed on the wafer in the front-end process is processed and completed as a product. The front-end process includes a step of transferring a pattern of a mold onto a resin on a substrate by using the above-described imprinting method or imprinting apparatus. The back-end process includes an assembly step (dicing and bonding) and a packaging step (sealing). A liquid crystal display device is formed by a method including a process of forming a transparent electrode. The process of forming a transparent electrode includes a step of applying resin to a glass substrate on which a transparent conductive film is deposited, and a step of transferring, by using the above-described imprinting method or imprinting apparatus, a pattern of a mold onto the glass substrate to which the resin has been applied. With the method for manufacturing an object according to the present embodiment, compared to a method according to the related art, a high-quality device can be manufactured at a lower cost.

An application device with which imprinting material can be easily replaced with another type of imprinting material or with imprinting material that is free from impurities can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2014/064227, filed May 29, 2014 which is hereby incorporated by reference herein in its entirety.

The invention claimed is:

1. An application device to supply an imprinting material to a substrate in an imprinting apparatus that forms a pattern on the imprinting material on the substrate by using a mold, the application device comprising:
   a container unit that contains the imprinting material;
   an ejecting unit that is provided on the container unit and that ejects the imprinting material contained in the container unit toward the substrate;
   a connecting portion that is connectable to the container unit; and
   a supplying portion formed on the connecting portion,
   wherein the application device is detachably attachable to the imprinting apparatus, and
   wherein the imprinting material is supplied to the container unit through a supplying portion formed on the connecting portion.

2. The application device according to claim 1, further comprising a supply hole formed in the container unit and through which the imprinting material is supplied to the container unit.

3. The application device according to claim 1, further comprising an extraction hole that is formed in the container unit and through which the imprinting material is extracted from the container unit.

4. The application device according to claim 1, further comprising:
   a pump for extracting the imprinting material from the container unit; and
   filtering means that filters the imprinting material extracted by the pump,
   wherein the imprinting material filtered by the filtering means is supplied to the container unit.

5. An application device to supply an imprinting material to a substrate in an imprinting apparatus that forms a pattern on the imprinting material on the substrate by using a mold, the application device comprising:
   a container unit that contains the imprinting material;
   an ejecting unit that is provided on the container unit and that ejects the imprinting material contained in the container unit toward the substrate;
   a supply hole formed in the container unit and through which the imprinting material is supplied to the container unit; and
   a storage unit that stores an imprinting material to be supplied to the container unit,
   wherein the storage unit includes a connecting portion that is connectable to the container unit, and
   wherein the imprinting material stored in the storage unit is supplied to the container unit through a supplying portion formed on the connecting portion and the supply hole.

6. The application device according to claim 5, wherein, after the imprinting material contained in the container unit is extracted through the supply hole, the imprinting material stored in the storage unit is supplied to the container unit through the supplying portion formed on the connecting portion and the supply hole.

7. The application device according to claim 6, wherein the storage unit includes filtering means that filters the imprinting material extracted from the container unit, and
   wherein the imprinting material extracted through the supplying portion is filtered by the filtering means, and the imprinting material filtered by the filtering means is supplied to the container unit through the supplying portion.

8. An application device to supply an imprinting material to a substrate in an imprinting apparatus that forms a pattern on the imprinting material on the substrate by using a mold, the application device comprising:
   a container unit that contains the imprinting material;
   an ejecting unit that is provided on the container unit and that ejects the imprinting material contained in the container unit toward the substrate;
   an extraction hole that is formed in the container unit and through which the imprinting material is extracted from the container unit;
   a supply hole formed in the container unit and through which the imprinting material is supplied to the container unit; and
   a storage unit that stores an imprinting material to be supplied to the container unit,
   wherein the storage unit includes a connecting portion that is connectable to the container unit,
   wherein the imprinting material stored in the storage unit is supplied to the container unit through a supplying portion formed on the connecting portion and the supply hole, and
   wherein the imprinting material contained in the container unit is extracted to the storage unit through an extracting portion formed on the connecting portion and the extraction hole.

9. The application device according to claim 8, wherein the storage unit includes filtering means that filters the imprinting material extracted from the container unit, and
   wherein the imprinting material extracted through the extracting portion is filtered by the filtering means, and the imprinting material filtered by the filtering means is supplied to the container unit through the supplying portion.

10. The application device according to claim 8, wherein the storage unit includes a measurement device that measures a state of an imprinting material, and
    wherein the imprinting material subjected to the measurement performed by the measurement device is supplied to the container unit through the supplying portion.

11. The application device according to claim 9, wherein the storage unit includes a measurement device that measures a state of an imprinting material,
    wherein the measurement device measures the state of the imprinting material extracted from the container unit, and
    whether or not the extracted imprinting material needs to be filtered is determined on the basis of the result of the measurement performed by the measurement device.

12. The application device according to claim 9, wherein a defect of the pattern formed on the substrate by the imprinting apparatus is measured, and whether or not imprinting material contained in the container unit needs to be filtered by the filtering means is determined on the basis of the result of the measurement.

13. The application device according to claim 9, wherein the number of times the pattern has been formed on the substrate by the imprinting apparatus is measured, and whether or not the imprinting material contained in the container unit needs to be filtered by the filtering means is determined on the basis of the result of the measurement.

14. The application device according to claim 9, wherein a time for which the imprinting material has been contained in the container unit is measured, and whether or not the imprinting material contained in the container unit needs to be filtered by the filtering means is determined on the basis of the result of the measurement.

15. The application device according to claim 11, wherein, when it is determined that the imprinting material needs to be filtered, the imprinting material contained in the container unit is extracted through the extraction hole, the extracted imprinting material is filtered by the filtering means, and the imprinting material filtered by the filtering means is supplied to the container unit through the supply hole.

16. The application device according to claim 8, wherein the connecting portion is moved so that the supplying portion and the supply hole are connected to each other and the extracting portion and the extraction hole are connected to each other.

17. The application device according to claim 8, wherein the container unit is moved so that the supplying portion and the supply hole are connected to each other and the extracting portion and the extraction hole are connected to each other.

18. The application device according to claim 5, wherein the application device is detachably attachable to the imprinting apparatus.

19. An imprinting apparatus that forms a pattern on an imprinting material on a substrate by using a mold, the imprinting apparatus comprising:

an application device that applies the imprinting material to the substrate, wherein the application device is the application device according to claim 1.

20. A method for manufacturing an object, comprising:

a step of forming a pattern on a substrate by using the imprinting apparatus according to claim 19; and a step of processing the substrate on which the pattern has been formed by the step of forming the pattern on the substrate.

* * * * *